US006884126B2

(12) United States Patent
Johns et al.

(10) Patent No.: US 6,884,126 B2
(45) Date of Patent: Apr. 26, 2005

(54) MICRO CONNECTOR TO FACILITATE TESTING OF MICRO ELECTRONIC COMPONENT AND SUBASSEMBLIES

(75) Inventors: Daniel Johns, Rochester, MN (US); Thomas Myhre, Sr., Stewartville, MN (US); Jeffrey Hames, Rochester, MN (US)

(73) Assignee: Pemstar, Inc., Rochester, MN (US)

( * ) Notice: Subject to any disclaimer, the term of this patent is extended or adjusted under 35 U.S.C. 154(b) by 0 days.

(21) Appl. No.: 10/301,433

(22) Filed: Nov. 21, 2002

(65) Prior Publication Data

US 2003/0064629 A1 Apr. 3, 2003

Related U.S. Application Data

(63) Continuation-in-part of application No. 10/190,329, filed on Jul. 3, 2002, now abandoned..
(60) Provisional application No. 60/308,514, filed on Jul. 27, 2001.

(51) Int. Cl.[7] ................................................ H01R 4/50
(52) U.S. Cl. ........................................................ 439/864
(58) Field of Search ................................. 439/864, 862, 439/73, 330, 331, 482, 259–265, 266–270, 701, 541; 324/72.5, 158, 157, 754, 757, 762

(56) References Cited

U.S. PATENT DOCUMENTS

| 4,987,364 | A | | 1/1991 | Watts |
| 5,626,481 | A | * | 5/1997 | Abe ............................ 439/73 |
| 5,913,687 | A | | 6/1999 | Rathburn |
| 6,300,784 | B1 | * | 10/2001 | Yamamoto ................... 324/762 |
| 6,476,626 | B1 | | 11/2002 | Aldaz et al. |
| 6,572,396 | B1 | * | 6/2003 | Rathburn ..................... 439/260 |

* cited by examiner

*Primary Examiner*—Alex Gilman
(74) *Attorney, Agent, or Firm*—Dorsey & Whitney LLP

(57) ABSTRACT

The present invention is a testing apparatus which includes a contact connector comprised of a housing with contact blades extending from the housing. The contact blades are pivotally mounted to the housing by pivot rods. A biasing element is coupled to the contact blades, providing resistance against rotary movement of the contact blade in one direction. In one embodiment, the housing has a comb structure including a plurality of slots and slot division walls between the slots. A spacer is disposed in each of the slots, and the contact blades are aligned with the slot division walls.

10 Claims, 11 Drawing Sheets

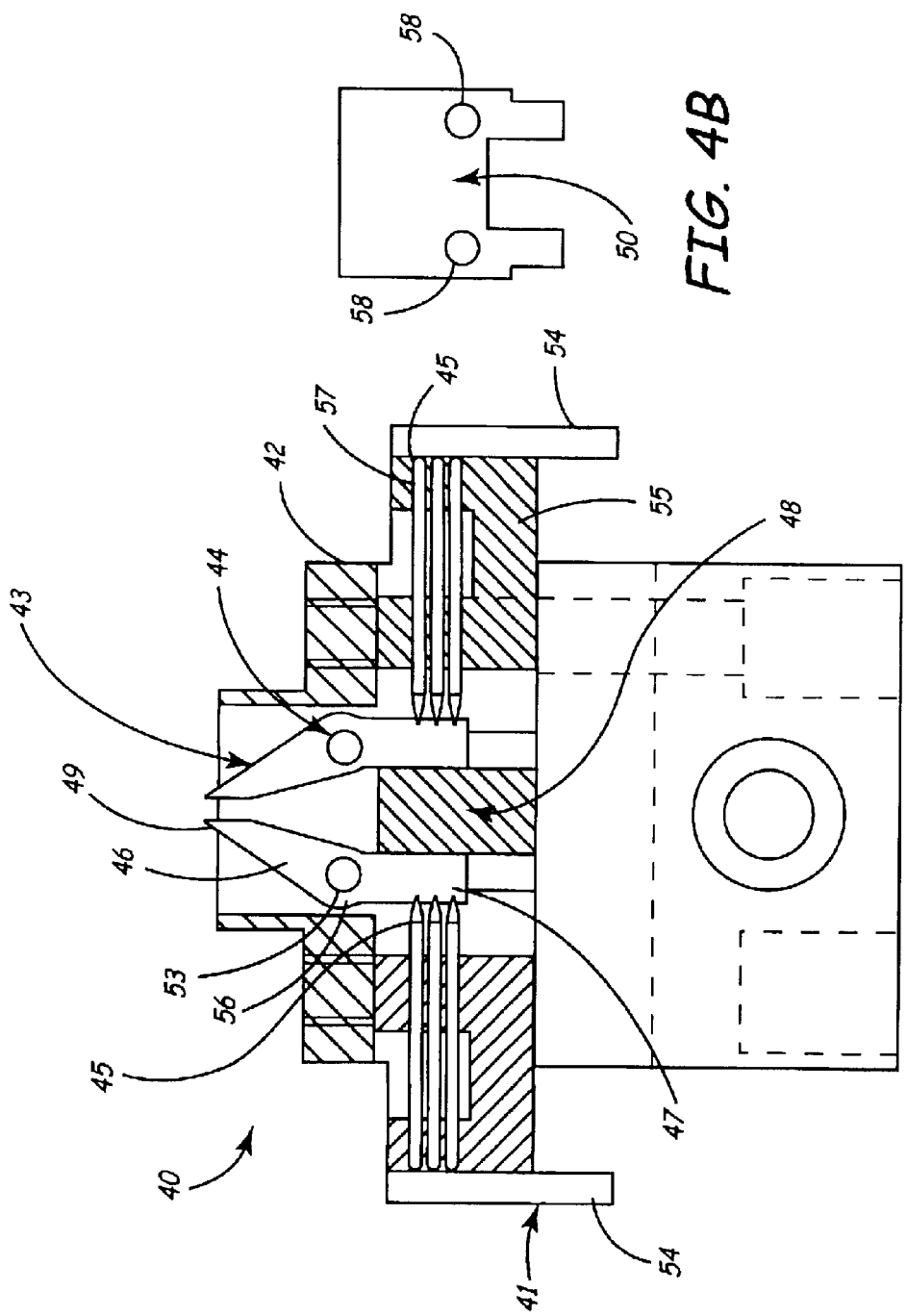

MICRO CONNECTOR TO FACILITATE TESTING OF MICRO ELECTRONIC COMPONENT AND SUBASSEMBLIES

CROSS-REFERENCE TO RELATED APPLICATION(S)

This application is a Continuation-In-Part (CIP) patent application of non-provisional patent application, Ser. No. 10/190,329, filed on Jul. 3, 2002, now abandoned, which claims priority from U.S. Provisional Application No. 60/308,514 entitled "Micro Connector to Facilitate Testing of Micro Electronic Components and Subassemblies," filed on Jul. 27, 2001 the subject matter of which are hereby incorporated by reference.

FIELD OF THE INVENTION

This invention relates generally to a testing apparatus for contact connectors. More particularly, the invention relates to a testing apparatus which can mate with a connector of a device under test without damaging the connector.

BACKGROUND OF THE INVENTION

Contact connectors such as the one shown in FIG. 1 are well known. These connectors are typically used to removably connect circuits to each other. As shown in FIG. 2, connectors are commonly used in conjunction with a flex cable 20 to connect circuits located on circuit boards or peripheral devices to each other.

FIG. 1 shows a typical female-type embodiment of a connector, this embodiment is comprised of a contact 10 and a housing 11, with the contact having a leg 12 which extends from the housing and a contact surface 13. The female type connectors will typically mate with a male-type connector like the one shown in FIG. 3. The male-type connector also has a housing 30, a contact 32, and a leg 34. The contact 32 also has a contact surface 36. The male-type connector is configured so that when the housing for the male-type connector mates with the housing for the female type connector, the contacts of one connector touches that of the other.

During normal use electrical contact between the female contact connector and the male contact connector are typically quite reliable because the two remain statically mated. In this condition, the contact 10 is displaced by the contact 32 and the resiliency of the contact 10 resists this displacement. As a result, contact pressure is created between the contact 10 and the contact 32 which forces good contact between the two.

However, repeated insertion and removal of a male contact connector reduces the resiliency of the contact 10. After repeated insertions and removals, the contact 10 no longer resists displacement and simply deforms. A deformed contact 10 will typically cause insufficient contact pressure between the contact 10 and the contact 32, and as a result, there is inconsistent continuity between the circuits being connected.

This problem can occur during testing of circuits or flex cables. Testing often requires repeated insertion and removal of a male contact connector into the female-type connector. As stated above this repeated insertion and removal may damage the female-type connector. In order to avoid this damage, a male-type connector is needed which would apply minimal pressure to the contact 10 so that the contact is not displaced. Yet, there must be sufficient contact pressure between the contact 10 and a male contact to provide good contact between the two.

BRIEF SUMMARY OF THE INVENTION

Accordingly, the subject invention is a testing apparatus with a novel connector which provides repeatable, reliable electrical contact when mated to an opposite connector, without deforming the contacts of the opposite connector. In one embodiment, the subject connector is configured as a male-type contact connector especially adapted to mate with a common female-type contact connector. The connector includes a housing with contact blades extending from the housing. The contact blades are pivotally mounted to the housing by pivot rods, and a biasing element is coupled to the contact blades providing resistance against rotary movement of the contact blade in one direction.

Due to the angle of the contact surface and the rotary movement of the contact blades, a contact blade on a female-type connector is not displaced by the insertion of the male-type contact connector. The contact blades on the male-type connector rotate to accommodate the presence of a contact from a female-type connector while the biasing elements provide sufficient resistance to this rotary movement to allow good contact pressure. As a result, even with repeated insertion and removal of the male type connector, the female-type connector experiences little deformation and retains its ability to maintain good contact.

In one embodiment, the testing apparatus is comprised of a base with the male-type contact connector mounted onto the base. The male-type connector is generally adapted to mate with a connector on the specific device under test. The base carries additional circuitry which is in communication with the contact blades on the male-type connector, enabling the testing apparatus to communicate with the device under test.

While multiple embodiments are disclosed, still other embodiments of the present invention will become apparent to those skilled in the art from the following detailed description. As will be apparent, the invention is capable of modifications in various obvious aspects, all without departing from the spirit and scope of the present invention. Accordingly, the drawings and detailed description are to be regarded as illustrative in nature and not restrictive.

DETAILED DESCRIPTION OF THE DRAWINGS

For the purpose of facilitating an understanding of the invention, there is illustrated the accompanying drawings, from an inspection of which, when considered in connection with the following description, the invention, its construction and operation, and many of its advantages should be readily understood and appreciated.

FIG. 4 is a cross-sectional view of one embodiment of a testing apparatus in accordance with the principles of the present invention.

FIG. 4b is a cross-sectional view of one embodiment of a spacer in accordance with the principles of the present invention.

Figure 5:
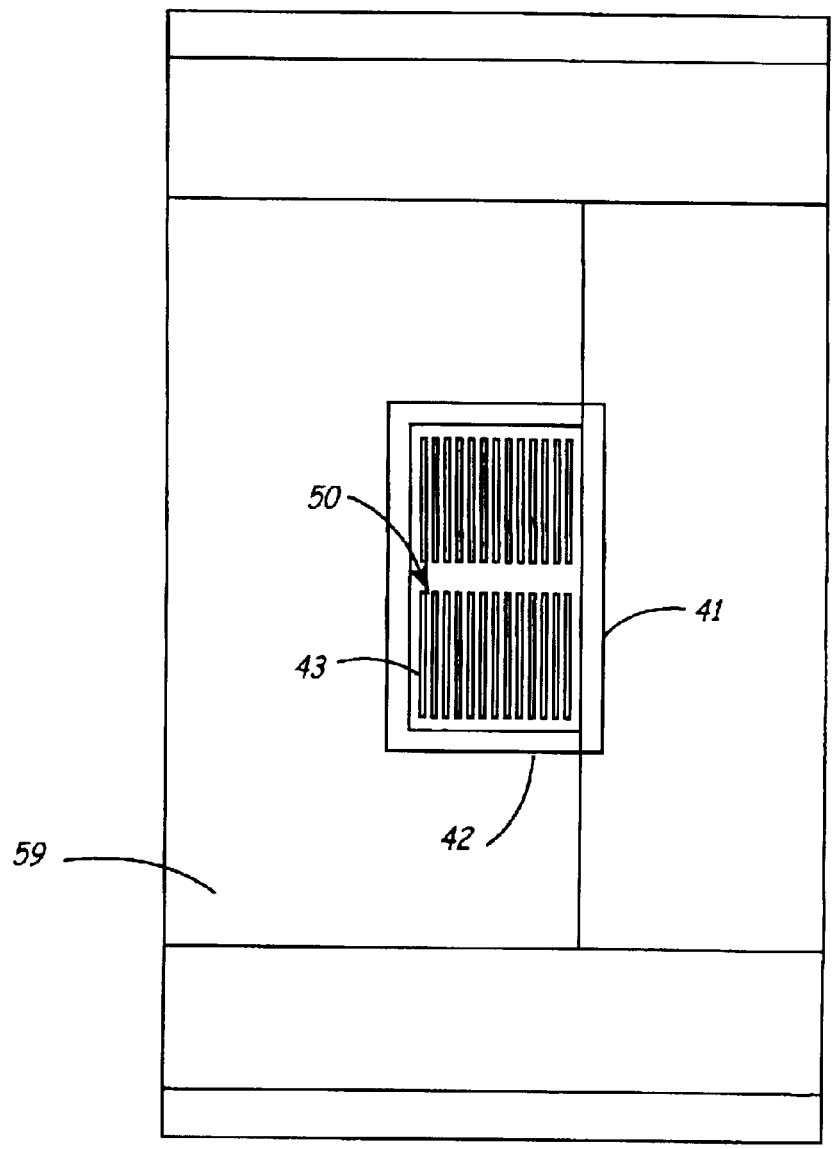
FIG. 5 is a reduced, overhead, planar view of the testing apparatus of FIG. 4 in accordance with the principles of the present invention.
Figure 10:
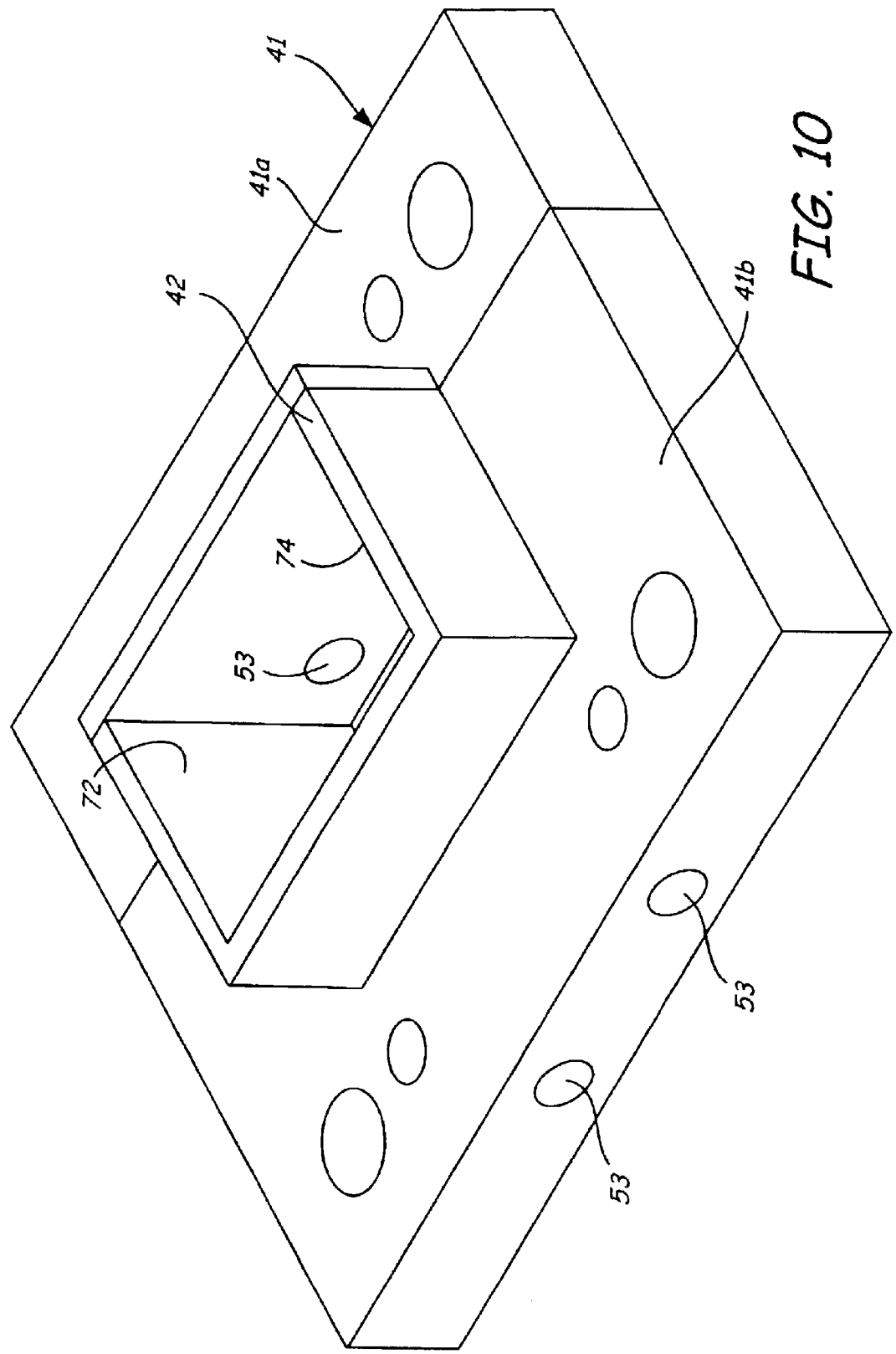

FIG. 10, an enlarged perspective view of one embodiment of a blade/spacer housing of the connector as shown in FIG. 5 in accordance with the principles of the present invention.

Figure 11:
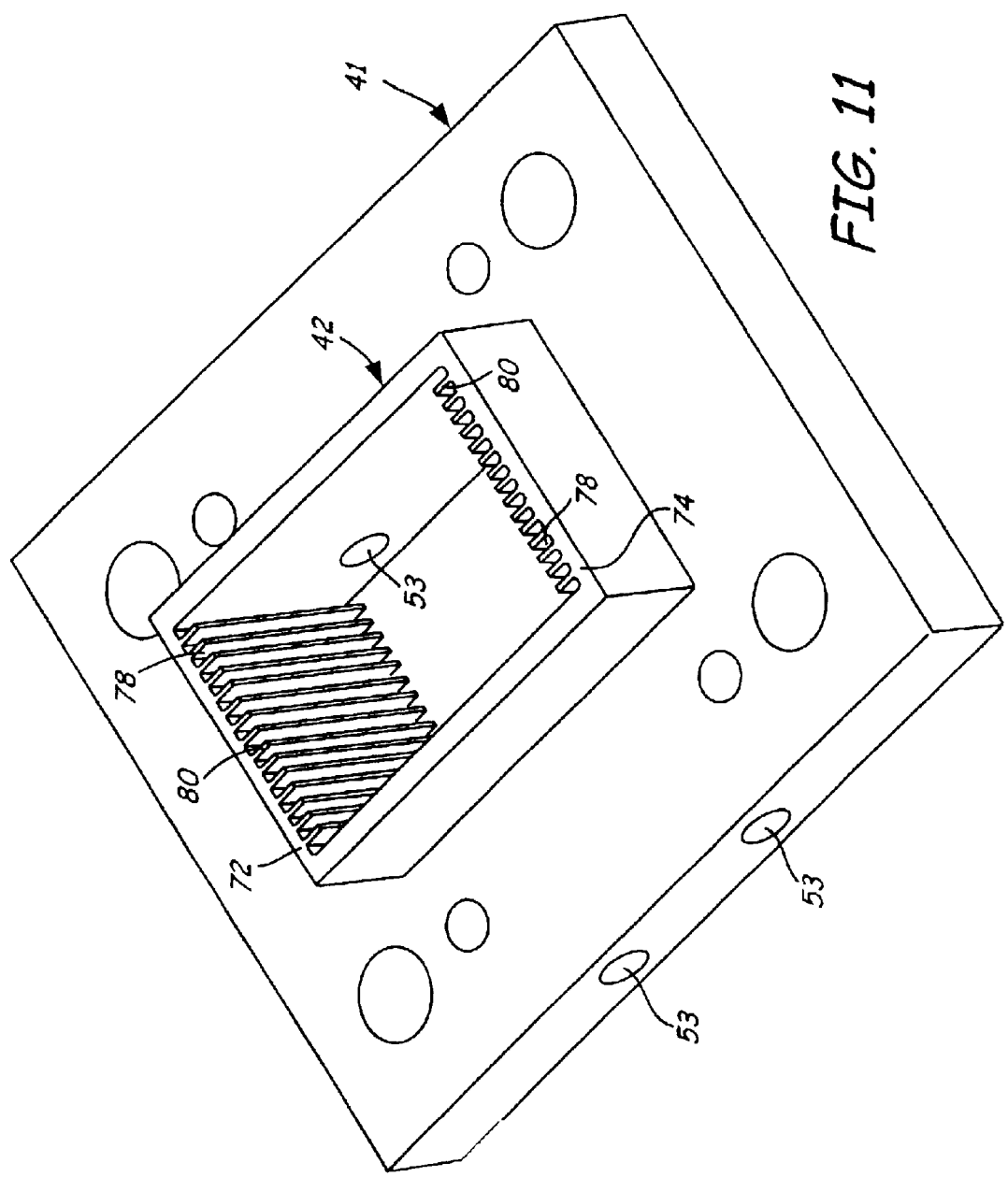

FIG. 11, an enlarged perspective view of another embodiment of a blade/spacer housing of the connector as shown in FIG. 5 in accordance with the principles of the present invention.

DETAILED DESCRIPTION OF THE INVENTION

The subject invention is a testing apparatus with a novel connector which provides repeatable, reliable, electrical contact when mated to an opposite connector, without deforming the contacts of the opposite connector. As shown in FIG. 4, in one embodiment, the subject connector is configured as a male-type contact connector especially adapted to mate with a common female-type contact connector. However, one skilled in the art can readily appreciate that the subject invention can be easily modified to accommodate a number of different types of contact connectors.

As shown in FIG. 4, in one embodiment, the testing apparatus 40 includes a male-type contact connector 41 comprised of a housing 42 with contact blades 43 extending from the housing. The contact blades 43 are pivotally mounted to the housing 42 by pivot rods 44. A biasing element 57 is coupled to the contact blades 43, providing resistance against rotary movement of the contact blade in one direction.

In one embodiment, each contact blade 43 includes a contact portion 46, a central portion 56, and a base portion 47. An aperture 53 extends through the central portion of the contact blade, the aperture being sized to allow a pivot rod 44 to be disposed therein. The contact portion 46 also defines an angled contact surface 49 which extends from the housing 42.

In one embodiment, the thickness of the contact blade 43 is designed to be less than the contact width of a contact blade on a female connector to be mated with. Typically, the contact blades 43 are fabricated from about 0.13 mm feeler gauge sheet stock and electroless Nickel plated to a final thickness of about 0.14 mm. However, as one skilled in the art would readily appreciate, the width and tolerance of the contact blade is readily adaptable to conform to the size and spacing of a contact blade on a connector.

Figure 1:
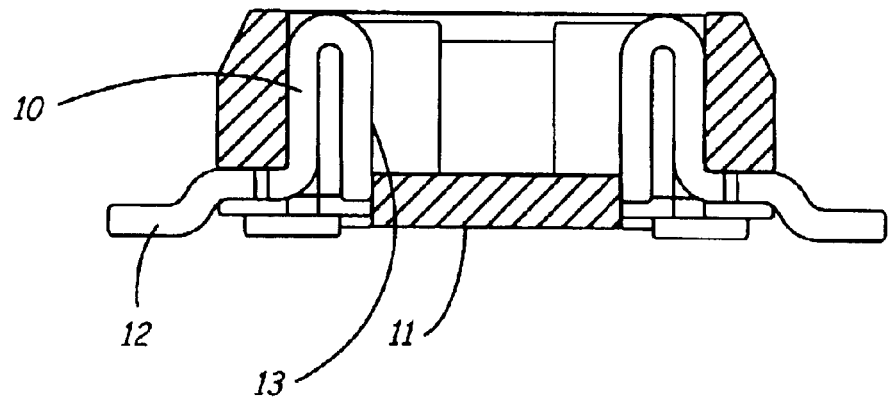
FIG. 1 (prior art) is a cross-sectional view of a female-type contact connector.
Figure 3:
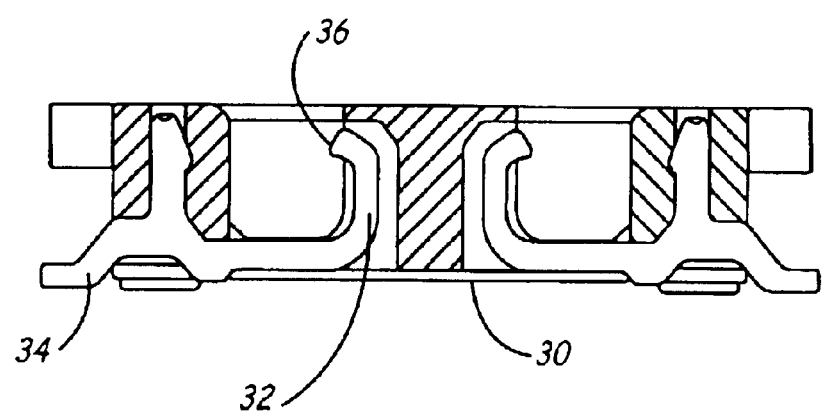
FIG. 3 (prior art) is a cross-sectional view of a male-type contact connector.
Figure 2:
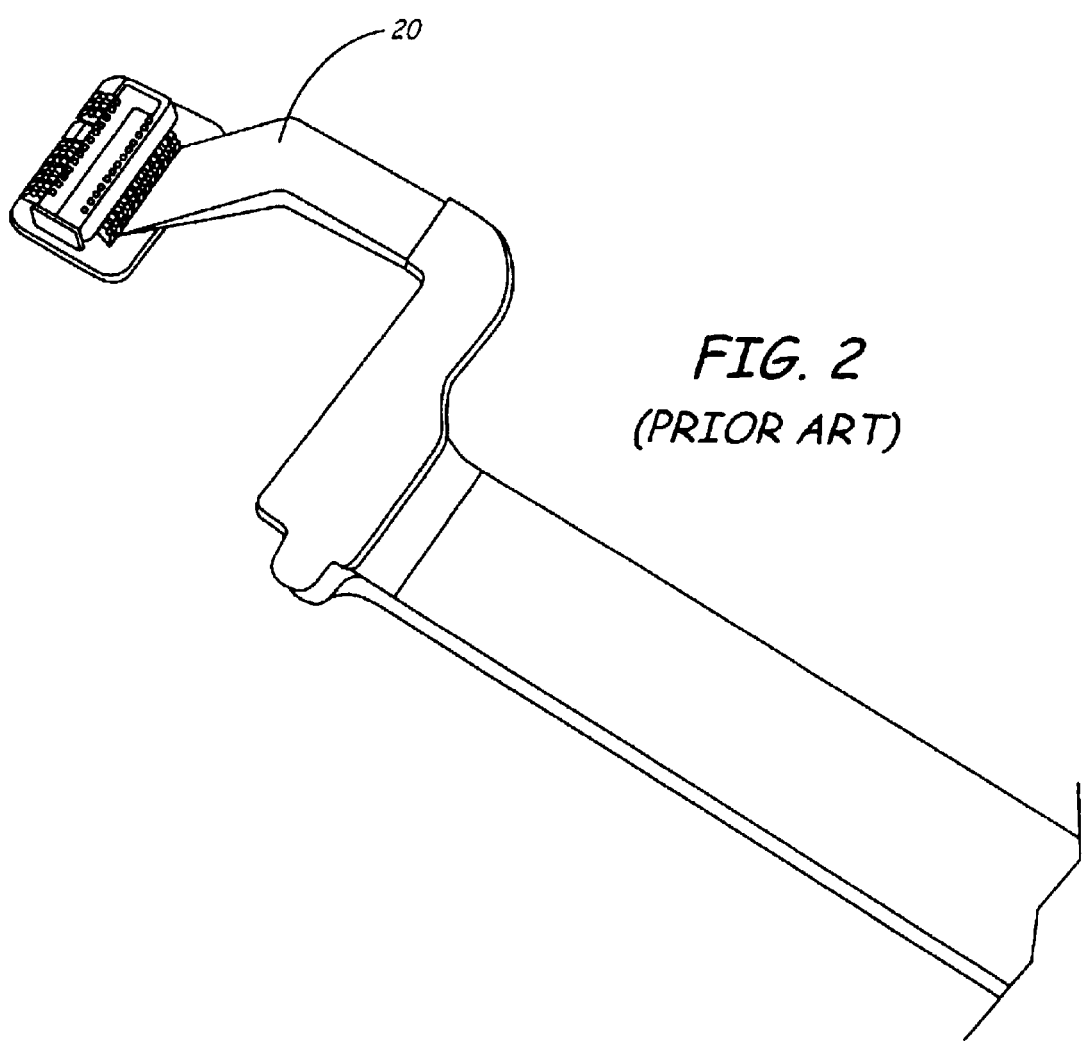
FIG. 2 (prior art) is a perspective view of a flex cable conductively coupled to the female-type contact connector of FIG. 1.
Figure 4A:
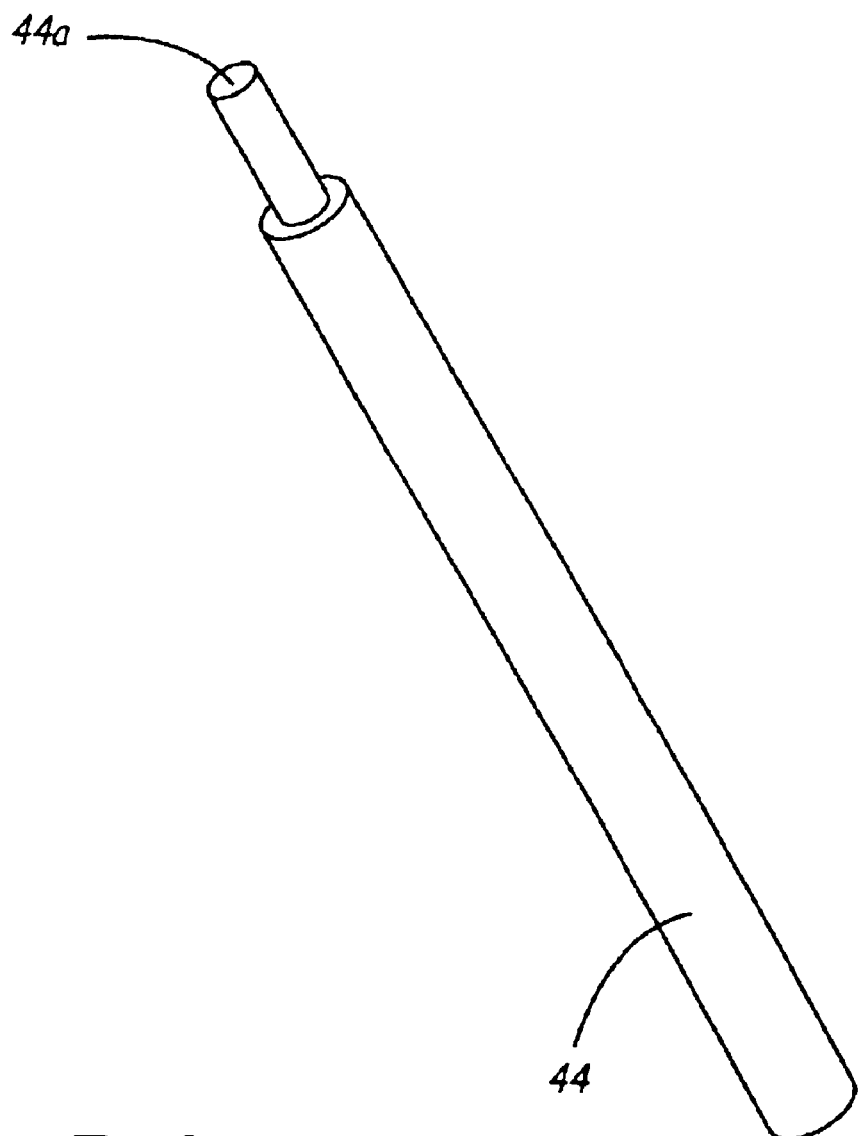
FIG. 4a is a perspective view of one embodiment of a pivot rod in accordance with the principles of the present invention.

In one embodiment, a pair of pivot rods 44 (as shown in FIG. 4a), preferably a Zirconia tube reinforced with a steel wire 44a, extend laterally along the housing 42 of the male-type contact connector 41. The pivot rods are generally parallel to each other, and they rotatively support a plurality of contact blades 43. The pivot rods 44 extend through the aperture 53 located on each contact blade 43, with each contact blade 43 rotating about the central axis of the pivot rod 44.

In one embodiment, the biasing element 57 is disposed within the housing 42 and is coupled to the base portion 47 of each contact blade 43. In one embodiment, the biasing element 57 serves a dual purpose. First, it provides an electrical connection from each contact blade to an output pin 54. Second, it provides resistance, in one direction, against the rotary movement of the contact blade 43 about the pivot rods 44. The direction of the bias provided is easily changed to accommodate a particular application.

The biasing element 57 provides a known, repeatable, resistance to the rotary movement of the contact blade. In one embodiment, the biasing element 57 is a flexible pin 45, preferably a pogo pin. However, it can be readily appreciated that a number of known components can be easily substituted for the flexible pin 45. A spring or any other resilient body can easily be accommodated to perform the same function as the flexible pin 45.

In one embodiment, the flexible pins 45 are disposed within non-conductive "U" shaped blocks 55 mounted within the housing. These U-shaped blocks 55 are preferably fabricated from G-11 fiber glass epoxy stock. Due to their size (diameter) these flexible pins 45 can be mounted in staggered tiers so that there is space available within the housing to accommodate a plurality of the pins.

In one embodiment, a stop 48 extends laterally within the housing, disposed between the contact blades 43. The stop 48 prevents rotational movement of the contact blade 43 in one direction, and maintains the orientation of the contact blade and spacer. The stop is fabricated from a non-conductive material such as G-11 fiberglass epoxy stock.

As shown in FIGS. 4 and 5, in one embodiment, the subject invention includes two parallel rows of contact blades 43 extending laterally across the housing 42. Each contact blade 43 is separated from a neighboring contact blade 43 in the same row by a generally non-conductive spacer 50. The spacer 50 extends between the pivot rods 44, and it has a pair of apertures 58 (as shown in FIG. 4B) which enables each pivot rod 44 to extend therethrough. Each spacer 50 is preferably fabricated from about 0.25 mm plastic shim stock and is designed to fill most of the space between the neighboring contact blades 43. For improved control of contact blade spacing and tolerance, spacers would preferably be fabricated from a ceramic or similar material that can be lapped to a close tolerance.

FIGS. 10 and 11 show an enlarged view of two different embodiments of the housing 42 of the connector 41 as illustrated in FIG. 5. The housing 42 has a first side 72 and a second side 74 that are generally normal to the contact blades 43 and the spacers 50. In one embodiment as shown in FIG. 10, the sides 72 and 74 are machined smoothly. The contact blades 43 and spacers 50 are stacked up on the pivot rods 44. In another embodiment as shown in FIG. 11, a comb structure is configured. The sides 72 and 74 include a plurality of slots 78 to accommodate the spacers 50, and a plurality of parallel slot division walls 80 to align with the contact blades 43.

In general, the physical spacing of the contact blades 43 is determined by the thickness and tolerance of the blades 43 and spacers 50. The tolerances are generally cumulative. The embodiment of the housing 42 shown in FIG. 10 is preferably used in a relatively large contact space, for example in a contact space having 10–12 contact blades, but it may not be suited in a smaller contact space because smaller contacts in smaller spaces could lead to making no contact or shorting contacts together. The embodiment of the housing 42 shown in FIG. 11 is preferably used in a relatively smaller contact space. The slots 78 and slot division walls 80 shown in FIG. 11 provide a repeatable location for each spacer without accumulating tolerances buildup.

In one embodiment as shown in FIG. 11, the slots 78 are preferably wider than the thickness of the spacers 50, for example, by approximately 0.001 inch wider; and the corresponding slot division walls 80 are preferably narrower than the thickness of the contact blades 43, for example, by the same amount, i.e. by approximately 0.001 inch narrower.

The preferred method of fabrication of the spacer slots is NC wire EDM (Numerically Controlled wire Electrical Discharge Machining). While alternative fabrication methods and/or materials can be used, with EDM, each slot will have a given tolerance of location from a defined point, and the tolerances are not cumulative across the housing side face. Accordingly, the design and machining technique provide for significant extendibility of the test contact useful geometries to smaller contact areas, tighter contact packing, and increased number of contacts in a given space. Another advantage is that the slots 78 and the slot division walls 80 provide the housing 42 significant improvement in stiffness and rigidity.

Also, the connector 41 is preferably configured in one piece as shown in FIG. 11, as opposed to two pieces (41a, 41b) as shown in FIG. 10. The two-piece configuration may contribute to potential alignment tolerance problems and potential assembly problems. A single-piece configuration avoids the alignment problem and assembly problem.

Figure 6:
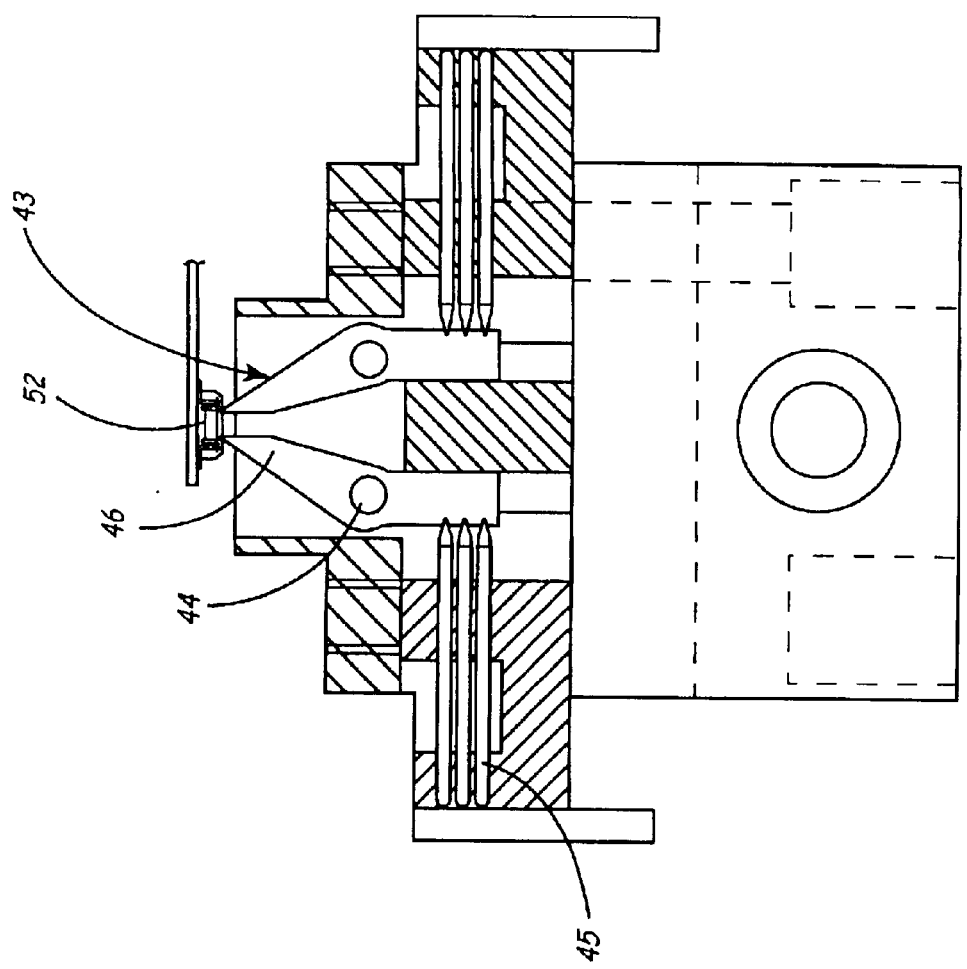
FIG. 6 is a cross-sectional view of the testing apparatus of FIG. 4 conductively coupled to a female-type contact connector in accordance with the principles of the present invention.
Figure 7:
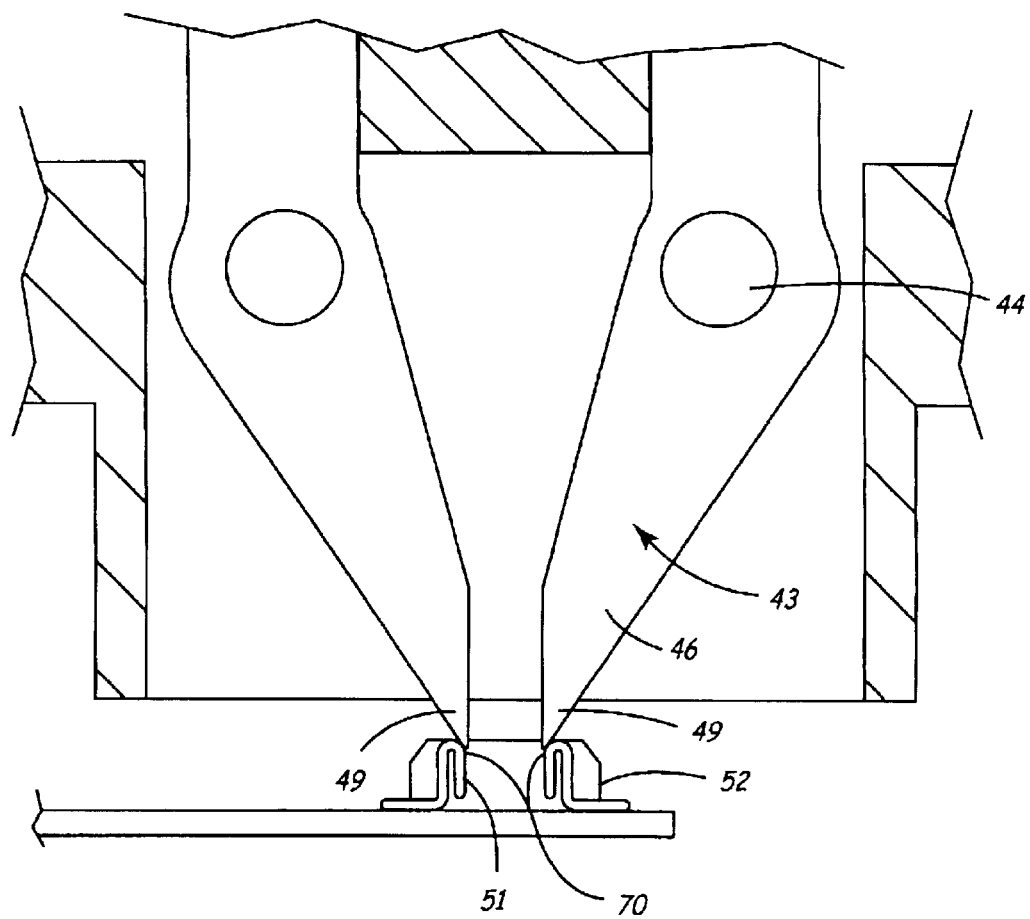
FIG. 7 is an enlarged view of FIG. 6 showing the testing apparatus of FIG. 4 conductively coupled to a female-type contact connector in accordance with the principles of the present invention.

In operation and as shown in the embodiments of FIGS. 6 and 7, the contact blades 43 are inserted into a female-type contact connector 52. The contact portion 46 protrudes above the spacers 50 enabling it to contact a female contact blade 51 of a female-type connector 52 being tested. The contact portion 46 protrudes roughly about 0.75 mm above the spacers 50. The contact surface 49 contacts an upper portion 70 of the female contact blade 51. Although the present invention has been described with reference to preferred embodiments, persons skilled in the art will recognize that changes may be made in form and detail without departing from the spirit and scope of the invention.

Upon insertion into the female-type connector 52, the contact blades 43 are displaced, rotating about the pivot rod 44. The flexible pin 45 provides a sufficient amount of resistance to the rotation so that there is sufficient contact pressure between the contact blade 43 and the female contact blade 51. Due to the angle of the contact surface 49 and the rotary movement of the contact blades 43, the female contact 51 is not displaced by the insertion of the male-type contact connector 41. Since there is little to no displacement of the female contact 51, the female contact does not deform, even after repeated insertion and removal of the male-type connector.

Figure 8:
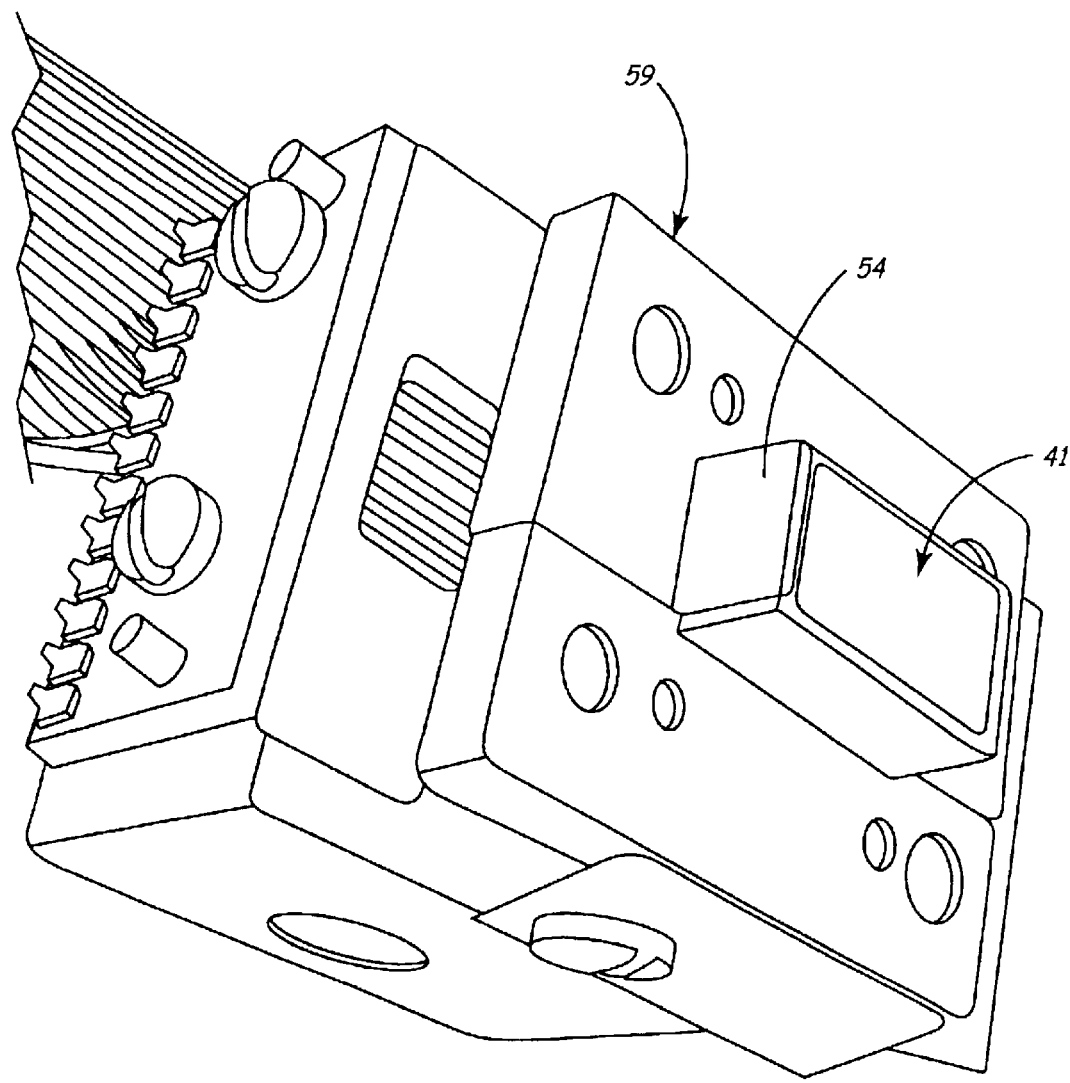
FIG. 8 is a top perspective view of a testing apparatus in accordance with the principles of the present invention.
Figure 9:
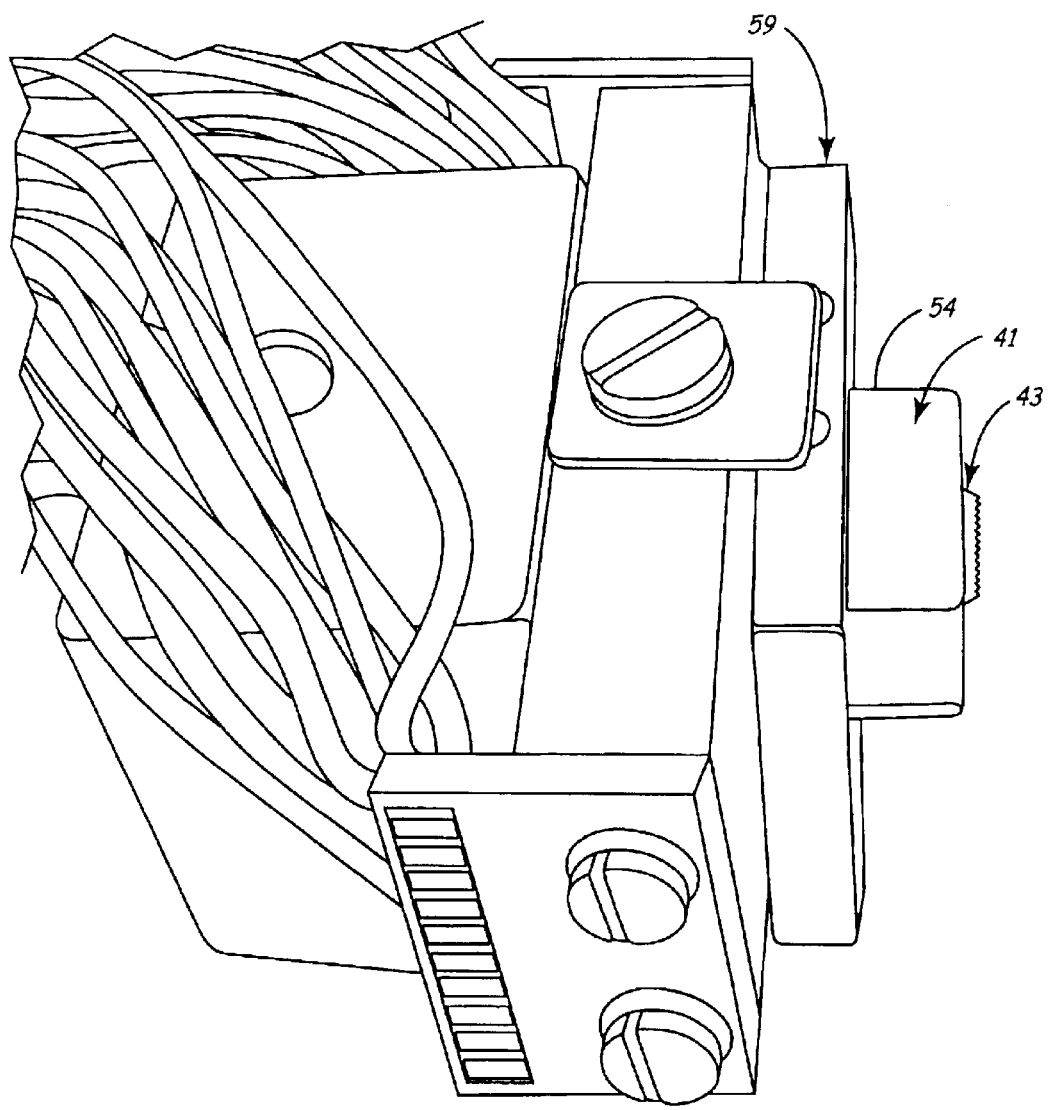
FIG. 9 is a side perspective view of the testing apparatus of FIG. 8.

As shown in FIGS. 8 and 9, in one embodiment, the testing apparatus comprises the male-type contact connector 41 and a base 59. The base 59 may include additional circuitry therein to communicate with the output pins 54 of the male-type connector 41, or the base may function solely as a support to the male-type connector 41. The testing apparatus can include additional components which utilize the male-type connector 41 to communicate with the device under test.

The testing apparatus can be applied manually to a device under test, or it can be actuated onto a device under testing. Alternatively, the device under testing can be actuated onto the testing apparatus. The actuator can be one that is known in the art.

While the subject invention has been described with reference to several embodiments thereof, those skilled in the art will recognize various changes that may be made without departing from the spirit and scope of the claimed invention. Accordingly, this invention is not limited to what is shown in the drawings and described in the specification. Any numbering or ordering of elements in the following claims is merely for convenience and is not intended to suggest that the ordering of the elements of the claims has any particular significance.

We claim:

1. A connector comprising:

a housing having a comb structure;

a plurality of contact blades pivotally disposed within the comb structure of the housing, each of the contact blades comprising a disengageable contact portion;

a biasing element in contact with each of the contact blades at end of each of the contact blades opposite the disengageable contact portion and opposing pivotal movement of the contact blades in one direction, wherein the biasing element is a flexible pin; and an output pin conductively coupled to the flexible pin.

2. The connector of claim 1, further comprising a rod coupled to each of the contact blades, the rod rotatably coupled to the housing.

3. The connector of claim 2, wherein the rod extends through the contact blades.

4. The connector of claim 1, wherein each of the contact blades further comprises a central portion and a base portion, and wherein the disengageable contact portion includes an angled contact surface and the central portion has an aperture extending therethrough.

5. The connector of claim 4, further comprising a plurality of non-conductive spacers, and wherein the rod extends through the spacers, the spacers are disposed between the blade contacts in the comb structure.

6. The connector of claim 1, the connector further comprising:

a plurality of non-conductive spacers, each spacer disposed between two of the contact blades.

7. The connector of claim 6 wherein each of the contact blades further comprise an aperture, wherein a rod rotatably disposed within the housing extends through the aperture of at least one of the contact blades.

8. The connector of claim 6, wherein each of the contact blades comprises a contact portion and a central portion, the contact portion having an angled contact surface and the central portion defining the aperture.

9. The connector of claim 6, wherein the comb structure comprises a plurality of slots.

10. A connector, comprising:

a housing having a comb structure, wherein the comb structure includes a plurality of slots and slot division walls between the slots;

a plurality of contact blades pivotally disposed within the comb structure of the housing, each of the contact blades comprising a disengageable contact portion; and a biasing element in contact with each of the contact blades at an end of each of the contact blades opposite the disengageable contact portion and opposing pivotal movement of the contact blades in one direction.

* * * * *